United States Patent
Wang (10) Patent No.: US 12,206,407 B2
(45) Date of Patent: *Jan. 21, 2025

(54) MULTI-TERMINATION SCHEME INTERFACE

(71) Applicant: Marvell Asia Pte, Ltd., Singapore (SG)

(72) Inventor: Lu Wang, Framingham, MA (US)

(73) Assignee: Marvell Asia Pte, Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 18/524,662

(22) Filed: Nov. 30, 2023

(65) Prior Publication Data
US 2024/0097682 A1 Mar. 21, 2024

Related U.S. Application Data

(63) Continuation of application No. 17/345,984, filed on Jun. 11, 2021, now Pat. No. 11,901,890, which is a continuation of application No. 15/789,420, filed on Oct. 20, 2017, now Pat. No. 11,063,591.

(51) Int. Cl.
*H03K 19/00* (2006.01)
*H03K 19/20* (2006.01)

(52) U.S. Cl.
CPC ......... *H03K 19/0005* (2013.01); *H03K 19/20* (2013.01)

(58) Field of Classification Search
None
See application file for complete search history.

(56) References Cited

U.S. PATENT DOCUMENTS

| | | | |
|---|---|---|---|
| 6,087,853 | A | 7/2000 | Huber |
| 6,222,339 | B1 | 4/2001 | Yamasaki et al. |
| 6,222,389 | B1 | 4/2001 | Williams |
| 6,452,428 | B1 | 9/2002 | Mooney |
| 7,795,919 | B2 | 9/2010 | Fujiwara |
| 7,834,654 | B2 | 11/2010 | Millar |
| 7,893,710 | B2 | 2/2011 | Lee |
| 8,531,205 | B1 | 9/2013 | Wang |
| 9,805,787 | B2 | 10/2017 | Ha |
| 11,063,591 | B2 | 7/2021 | Wang |
| 11,901,890 | B2 | 2/2024 | Wang |
| 2003/0006799 | A1 | 1/2003 | Ruesch |
| 2009/0015290 | A1 | 1/2009 | Park |
| 2019/0123746 | A1 | 4/2019 | Wang |
| 2021/0305983 | A1 | 9/2021 | Wang |

*Primary Examiner* — Jany Richardson
(74) *Attorney, Agent, or Firm* — Hamilton, Brook, Smith & Reynolds, P.C.

(57) ABSTRACT

In an embodiment, a method includes programming a control signal that specifies a target resistance and a target voltage in a circuit. The method further includes sending the control signal to at least one transistor configured to control a current flow in the circuit. The method further includes providing, as an output, a signal with the target voltage and target resistance.

30 Claims, 6 Drawing Sheets

MULTI-TERMINATION SCHEME INTERFACE

RELATED APPLICATION

This application is a continuation of U.S. application Ser. No. 17/345,984, filed Jun. 11, 2021, now U.S. Pat. No. 11,901,890, which is a continuation of U.S. application Ser. No. 15/789,420, filed Oct. 20, 2017, now U.S. Pat. No. 11,063,591. The entire teachings of the above applications are incorporated herein by reference.

BACKGROUND

Modern digital systems rely on the phase-locked loop (PLL) to provide high speed clocks to synchronize the circuit operations. Most widely used PLL architectures need to use a high quality lower frequency reference clock. A reference clock receiver, therefore, is an essential block of these modern digital systems to provide the high quality reference clock.

SUMMARY

In an embodiment, a method includes programming a control signal that specifies a target resistance and a target voltage in a circuit. The method further includes sending the control signal to at least one transistor configured to control a current flow in the circuit. The method further includes providing, as an output, a signal with the target voltage and target resistance.

In an embodiment, the at least one transistor includes a first transistor, a second transistor, and a third transistor. The first transistor is coupled to allow current to flow between a voltage source and a first resistor. The second transistor is coupled to allow current to flow between ground and a second resistor. The third transistor is coupled to allow current to flow between ground and a third resistor. The first, second, and third resistors are further coupled with a printed circuit board (PCB) trace, the PCB trace receiving a transmission from a driver. The product of a first resistance of the first resistor and a second resistance of the second resistor divided by the sum of the first resistance and the second resistance produces the target resistance. The second resistance divided by the sum of the first resistance and the second resistance times a voltage of the voltage source is also the target voltage.

In an embodiment, a first control signal, configured to be in a first state, coupled to a gate of the first transistor is configured to allow current to flow through the first transistor. A second control signal, configured to be in a second state, coupled to a gate of the second transistor is configured to allow current to flow through the second transistor. A third control signal, configured to be in a third state, coupled to a gate of the third transistor is configured to prevent current from flowing through the third transistor.

In an embodiment, a first control signal, configured to be in a first state, coupled to a gate of the first transistor is configured to prevent current from flowing through the first transistor. A second control signal, configured to be in a second state, coupled to a gate of the second transistor is configured to allow current to flow through the second transistor. A third control signal, configured to be in a third state, coupled to a gate of the third transistor is configured to allow current to flow through the third transistor.

In an embodiment, a first control signal, configured to be in a first state, coupled to a gate of the first transistor is configured to prevent current from flowing through the first transistor. A second control signal, configured to be in a second state, coupled to a gate of the second transistor is configured to prevent current from flowing through the second transistor. A third control signal, configured to be in a third state, coupled to a gate of the third transistor is configured to prevent current from flowing through the third transistor.

In an embodiment, the method further includes generating a first gate signal, a second gate signal, and a third gate signal to input to each respective transistor based on a received first control signal and a second control signal. The first gate signal is generated based on a NOR operation of the second control signal and the inverse of the first control signal. The second gate signal is based on the second control signal. The third gate signal is based on a NAND operation of the inverse of the first control input and the inverse of the second control input.

In an embodiment, a system includes at least one transistor in a circuit configured to receive a control signal that specifies a target resistance and a target voltage in the circuit. The circuit provides, as an output, a signal with the target voltage and target resistance.

In an embodiment, a system for providing a power down circuit includes a first, second, third, fourth, and fifth transistors. The first transistor is coupled to allow current flow between a voltage source and a first resistor. The second transistor is coupled to allow current flow between a second resistor and a ground. The third transistor is coupled to allow current flow between the voltage source and an inverter. The fourth transistor is coupled to allow current flow between the ground and the inverter. The fifth transistor is coupled to allow current flow between a voltage source and an output of the inverter.

In an embodiment, the second transistor and third transistor are configured to allow current when receiving a power down signal, and the first transistor, fourth transistor, and fifth transistor are configured to allow current in response to an inverted signal of the power down signal.

In an embodiment, a method of providing a power down circuit includes providing a power down circuit having a first, second, third, fourth, and fifth transistors. The first transistor is coupled to allow current flow between a voltage source and a first resistor. The second transistor is coupled to allow current flow between a second resistor and a ground. The third transistor is coupled to allow current flow between the voltage source and an inverter. The fourth transistor is coupled to allow current flow between the ground and the inverter. The fifth transistor is coupled to allow current flow between a voltage source and an output of the inverter.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

A description of example embodiments follows.

One challenge of designing a reference clock receiver is accommodating different termination schemes with different common mode and voltage swing level requirements. In an embodiment of the present invention, a reference clock receiver can be configured for low-voltage positive-referenced emitter coupled logic (LVPECL) and high speed current steering logic (HCSL) with on-chip termination. A person of ordinary skill in the art can recognize that the reference clock receiver can further be configured to accommodate other logic configurations for on-chip termination as well as off-chip termination configurations, such as Complementary Metal Oxide Semiconductor (CMOS), Current-Mode Logic (CML), Low-Voltage Differential Signaling (LVDS), or Transistor to Transistor Logic (TTL). In another embodiment, the reference clock receiver can be configured as a general reference clock receiver with external termination to accommodate all the I/O standards, including LVPECL and HCSL.

Figure 1:
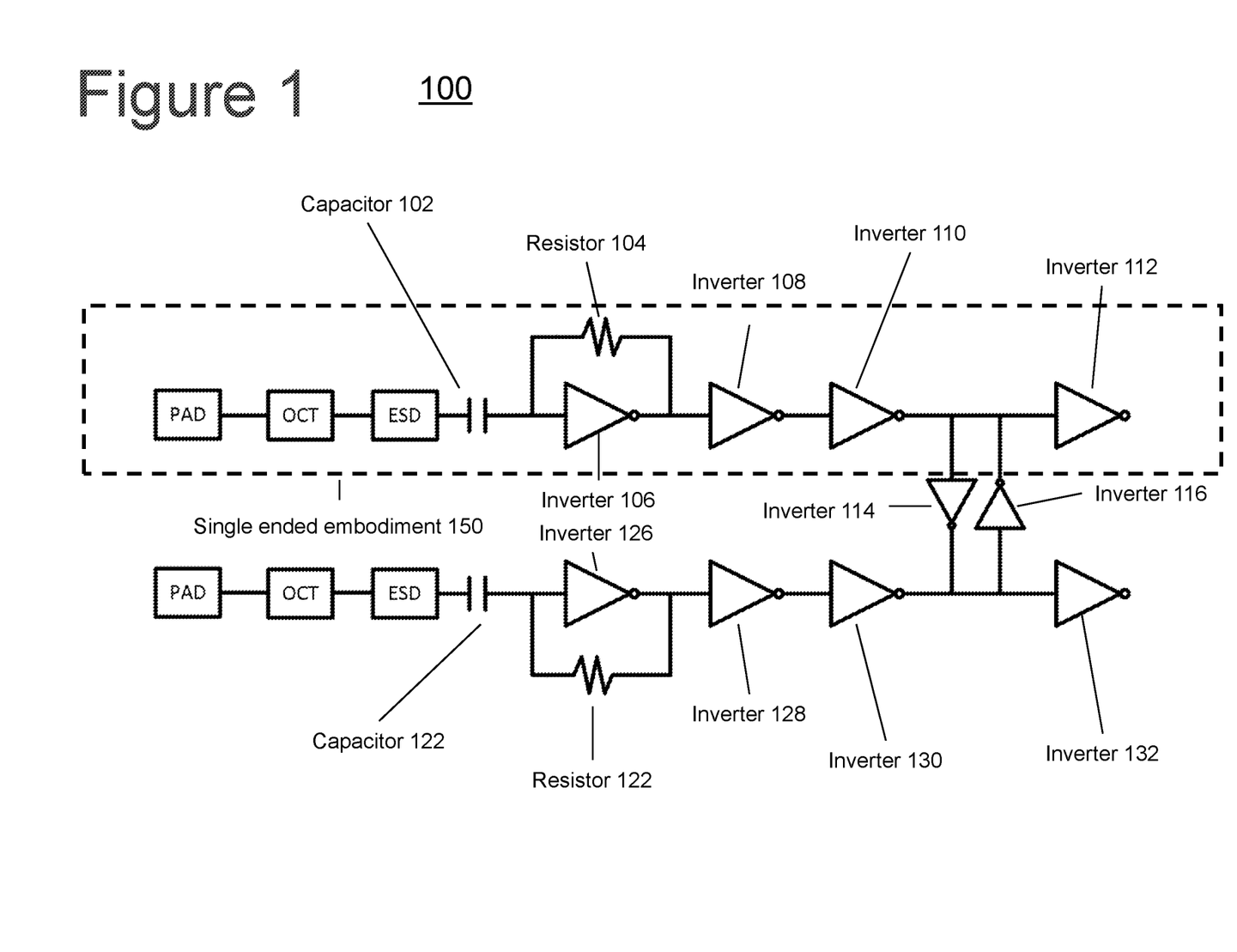
FIG. 1 is a block diagram illustrating an example embodiment of a pad (PAD) coupled with an on-chip termination (OCT) module and an electrostatic discharge (ESD) module.

FIG. 1 is a block diagram 100 illustrating an example embodiment of a pad (PAD) (e.g., a physical metal pad) coupled with an on-chip termination (OCT) module and an electrostatic discharge (ESD) module (e.g., a protection block). The blocks shown can be implemented in a single-ended embodiment 150, or in a differential embodiment (i.e., the entire FIG. 1). In embodiments, the OCT module includes novel and nonobvious improvements to reference clock receivers.

The ESD of the single ended embodiment 150 is coupled with a capacitor 102, which is coupled to an inverter 106 in parallel with a resistor 104. The output of the inverter 106 is coupled with inverters 108, 110, and 112.

Similarly, the second ESD module of the differential embodiment is coupled with a capacitor 122. The capacitor 122 is coupled with an inverter 126 and resistor 122 in parallel. The output of the inverter 126 is coupled with inverters 128, 130, and 132.

Further, the differential embodiment is connected at the outputs of respective inverters 110 and 130 and inputs of respective inverters 112 and 132. In particular, the output of inverter 110 and input of inverter 112 are both coupled with the input of an inverter 114 and output of an inverter 116. The output of inverter 130 and input of inverter 130 are coupled with the output of inverter 114 and input of inverter 116.

Figure 2:
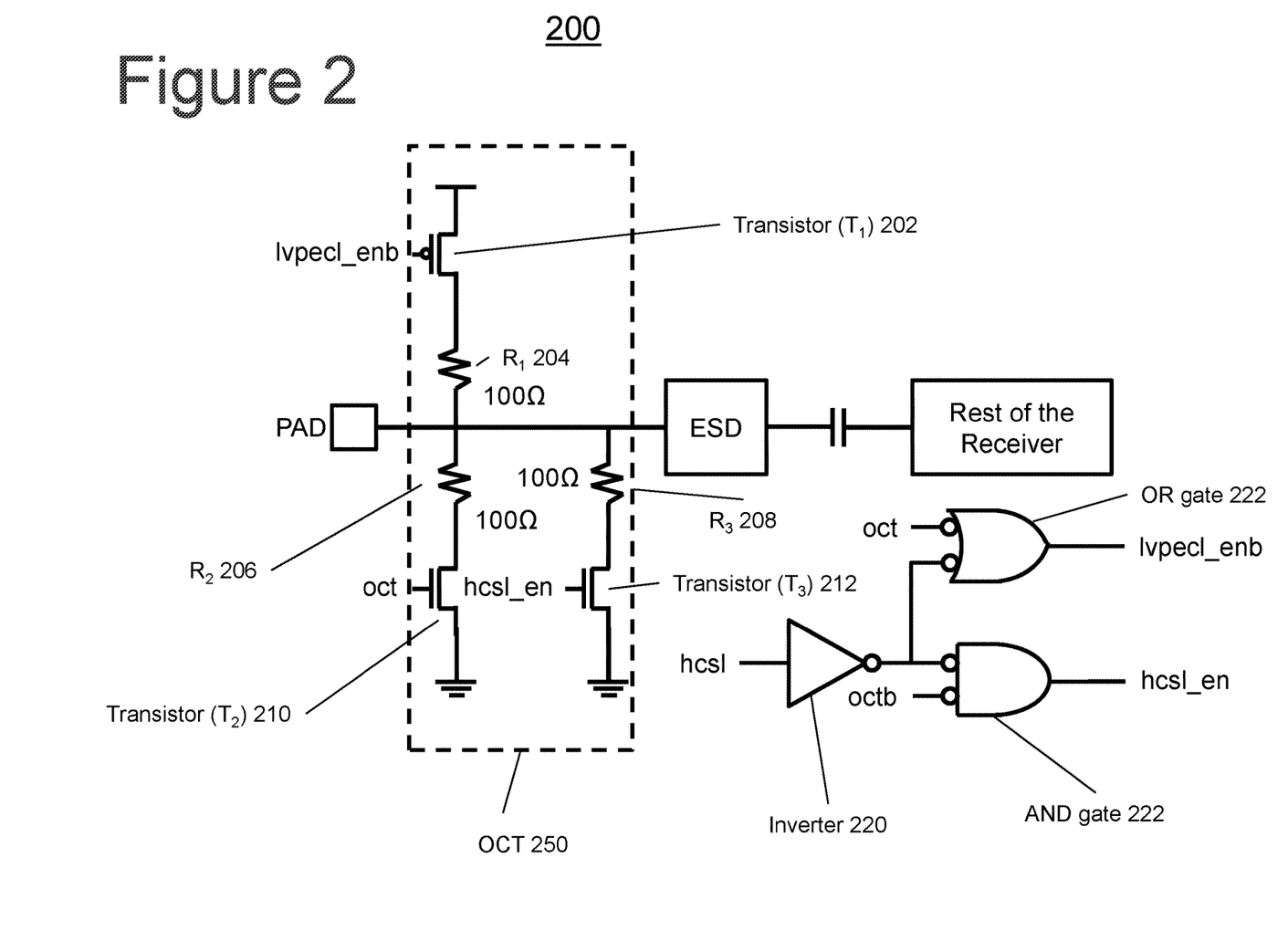
FIG. 2 is a block diagram illustrating an example embodiment of on-chip termination employed by the present invention.

FIG. 2 is a block diagram 200 illustrating an example embodiment of on-chip termination 250 employed by the present invention. The OCT module 250 receives input from the PAD (e.g., from a driver through the PAD). A Transistor ($T_1$) 202 is coupled to allow current flow from a voltage source to a resistor $R_1$ 204 in response to the appropriate gate signal "lvpecl_enb". A second transistor ($T_2$) 210 is coupled to allow current flow from a resistor $R_2$ 206 to a ground in response to the appropriate gate signal "oct." A third transistor ($T_3$) is coupled to allow current flow from a resistor $R_3$ to a ground in response to the appropriate gate signal "hcsl_en". The three resistors, $R_1$ 204, $R_2$ 206, and $R_3$ 208 are coupled, at the ends that are not coupled with their respective transistors $T_1$, $T_2$, and $T_3$, to each other. In this embodiment, the three resistors, $R_1$ 204, $R_2$ 206, and $R_3$ 208 further have a same resistance, which is 100 ohms.

With this setup, the three signals to the gates of the transistors (e.g., "lvpecl_enb," "oct," and "hcsl_en") can determine the mode that the OCT module 250 allows. This is due to a logic circuit that provides the appropriate signals based on an input signal indicating whether on chip termination is enabled (e.g., the "oct" signal), and a signal indicating whether HCSL should be enabled (e.g., the "hcsl" signal). The logic circuit includes an inverter 220, NAND gate 222, and NOR gate 222. A person of ordinary skill in the art can determine the operation of the logic circuit shown. Table 1 below indicates the preferred outcomes based on the OCT and HCSL digital signals.

TABLE 1

| | Signal Outcomes | |
| --- | --- | --- |
| | OCT = 0 | OCT = 1 |
| HCSL = 0 | External Termination | Provide On-Chip Termination with LVPECL configuration |
| HCSL = 1 | External Termination | Provide On-Chip Termination with HCSL configuration |

Further, Table 2 below indicates the signal values output by the logic circuit to accomplish these outcomes.

TABLE 2

| | Gate Signals | |
| --- | --- | --- |
| | OCT = 0 | OCT = 1 |
| HCSL = 0 | hcsl_en = 0<br>lvpecl_enb = 1 | hcsl_en = 0<br>lvpecl_enb = 0 |
| HCSL = 1 | hcsl_en = 0<br>lvpecl_enb = 1 | hcsl_en = 1<br>lvpecl_enb = 1 |

A person of ordinary skill in the art can extrapolate that different transistors may require inverted values to achieve the desired results in Table 1, for example, by replacing PMOS transistors with NMOS transistors or vice versa.

When "oct" is set to 1, however, the "hcsl" signal governs which mode is used by the OCT module 250.

When "hcsl" is 0, "hcsl_en" and "lvpecl_enb" are both set to 0. This causes current to flow through transistors $T_1$ 202 and $T_2$ 210, as therefore also resistors $R_1$ 204 and $R_2$ 206. The effect of this circuit configuration is further illustrated in FIG. 3.

When "hcsl" is 1, "hcsl_en" and "lvpecl_enb" are both set to 1. This causes current to flow through transistors $T_2$ 210 and $T_3$ 212, and therefore also resistors $R_2$ and $R_3$ 208. The effect of this circuit configuration is further illustrated in FIG. 4.

However, when the "oct" signal is 0, all of the transistors are turned off, and no current flows through them. The OCT module 250 effectively acts as a short between PAD and ESD. In this setting, the designer expects that external termination accommodates the termination standard being used. The effect of this circuit configuration is further illustrated in further detail in FIG. 5.

Figure 3:
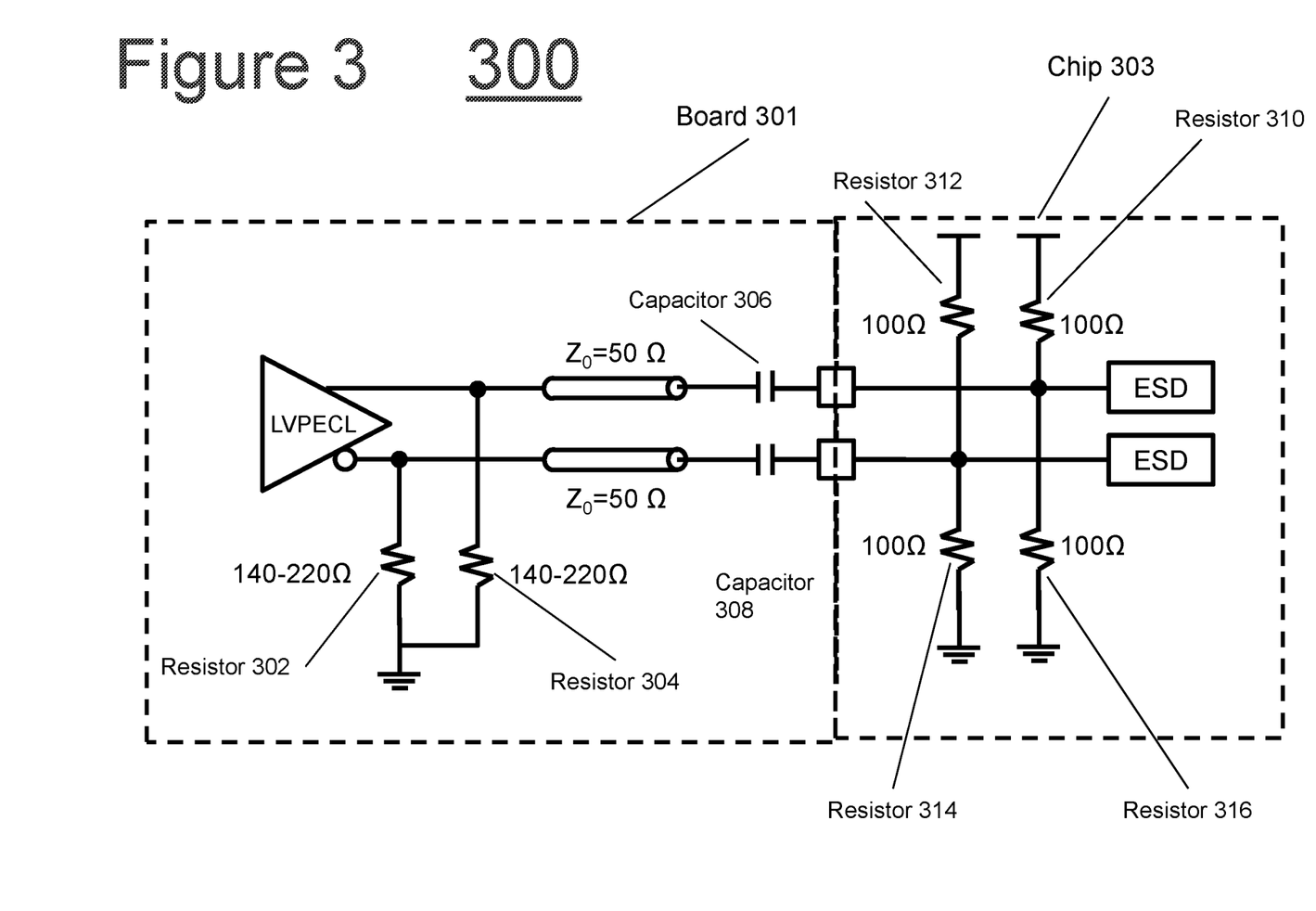
FIG. 3 is a diagram illustrating an example embodiment of a receiver configured for AC-coupled low-voltage positive-referenced emitter coupled logic (LVPECL) with on-chip termination.

FIG. 3 is a diagram 300 illustrating an example embodiment of the receiver configured for AC-coupled LVPECL with on-chip termination. In this embodiment, the "oct" signal of FIG. 2 is set to 1, and the "hcsl" signal is set to "0." This activates the LVPECL mode of the OCT module 250 of FIG. 2.

Therefore, the board 301 of FIG. 3 illustrates the LVPECL driver connected to the chip 303 via capacitors 306 and 308 and circuit elements introducing impedance of 50 ohms. Resistors 302 and 304 further couple each of the LVPECL lines to ground. The operation of the board 301 itself is unaffected by the "oct" and "hcsl" signals, however, the chip 303 is configured to receive a board 301 configured for such an LVPECL driver.

Chip 303 having the OCT module behaves as described in relation to FIG. 2. FIG. 3 shows a simplified version of its operation, with the transistors that allow current to flow being simplified to short circuits, and transistors that are closed to allow current to flow being open circuits. Therefore, each line is connected between two resistors 312 and 314, or 310 and 316, respectively. Resistors 312 and 310 are connected to a voltage source and resistors 314 and 316 are connected to ground. A person of ordinary skill in the art can recognize that FIG. 3 illustrates the differential embodiment, having two OCT modules receiving two separate signals.

Figure 4:
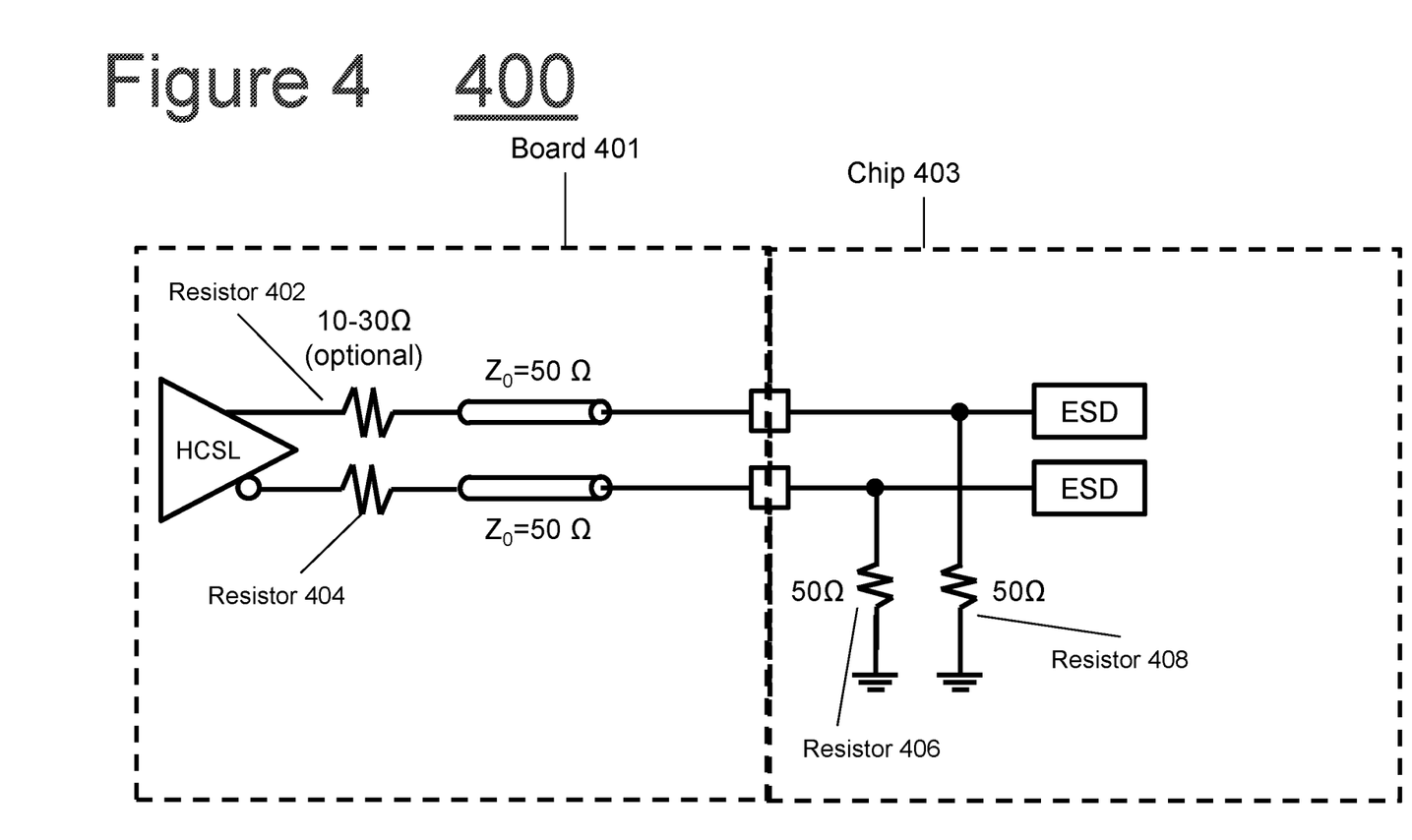
FIG. 4 is a diagram illustrating an example embodiment of a receiver configured for DC-coupling high speed current steering logic (HCSL) with on-chip termination.

FIG. 4 is a diagram 400 illustrating an example embodiment of the receiver configured for DC-coupling HCSL with on-chip termination. The board 401, in this example, provides an HCSL driver. The driver provides two differential lines, each having respective resistors 402 and 404 and impedance circuit elements providing impedance of 50 ohms. In this embodiment, the "oct" signal of FIG. 2 is set to 1, and the "hcsl" signal is set to 1. This activates the HCSL mode of the OCT module of FIG. 2.

Therefore, the board 301 of FIG. 4 illustrates the HCSL driver connected to the chip 403 via resistors 402 and 404 and impedance elements. Chip 403 having the OCT module behaves as described in relation to FIG. 2. FIG. 4 illustrates a simplified version of its operation, with the transistors that allow current to flow being simplified to short circuits and transistors that are closed to allow current to flow being open circuits. Therefore, as described in relation to FIG. 2, the transistors allowing current ($T_2$ and $T_3$) allow current through respective resistors $R_2$ and $R_3$, which are both connected to ground. Effectively, this simplifies to both $R_2$ and $R_3$ being in parallel, which is the same as one 50 ohm resistor. This simplification is shown in FIG. 4 in 50 ohm resistors 406 and 408 connected to each of the differential lines.

Figure 5:
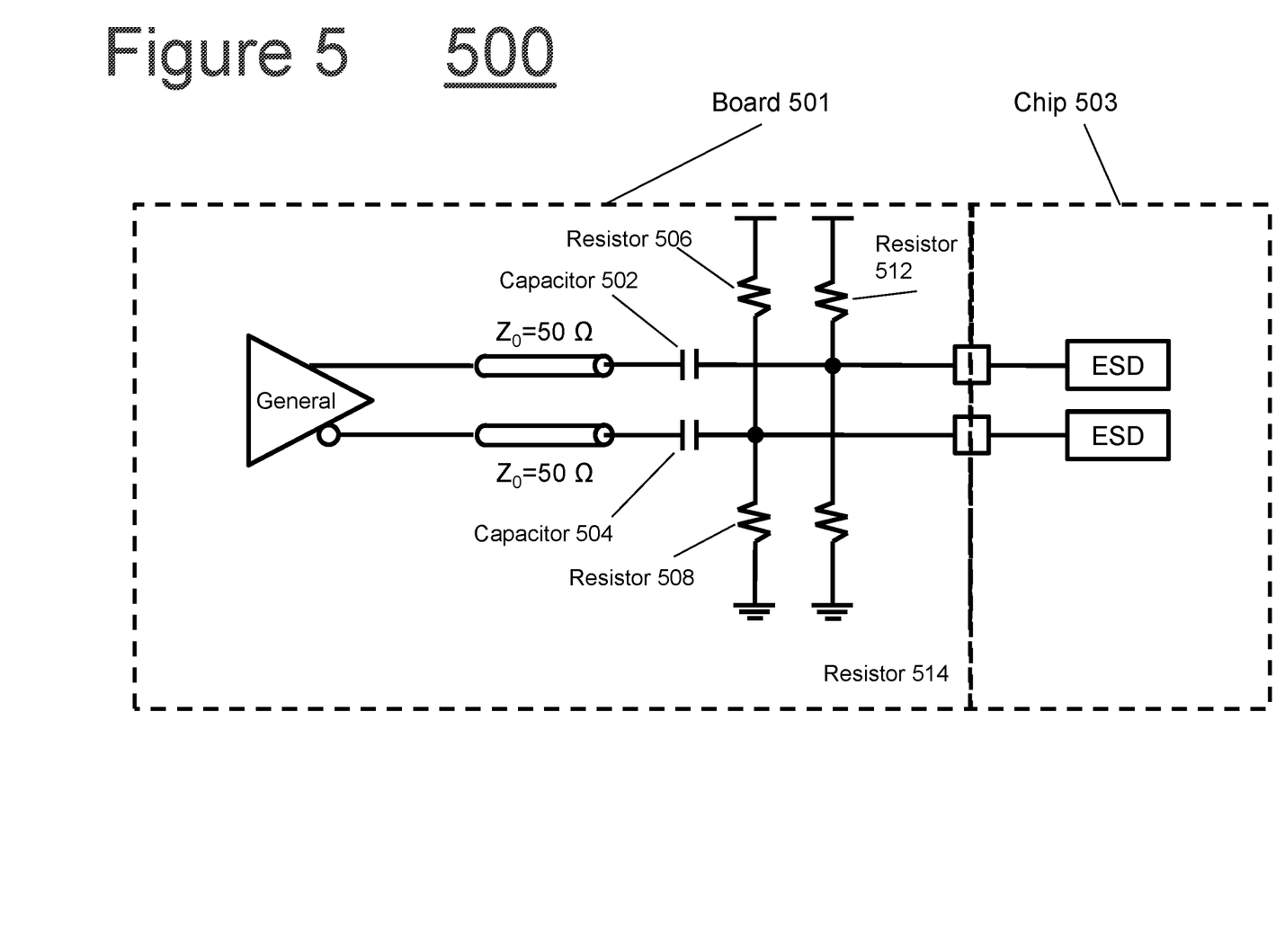
FIG. 5 is a diagram illustrating an example embodiment of a receiver configured for external termination.

FIG. 5 is a diagram 500 illustrating an example embodiment of the receiver configured for external termination. An advantage of on-chip termination is reducing the connector and package reflection. As a result, the receiver can have a better input clock signal. Further, a lower cost results for the receiver by having fewer internal (and therefore more external) parts. Therefore, drivers may be designed for external termination for this reason, and the OCT module 250 of FIG. 2 should accommodate those drivers that have external termination as well. Therefore, an external termination mode is desirable in certain scenarios and the OCT module 250 should be able to accommodate such a mode when provided by the driver shown in FIG. 2.

As shown by FIG. 2, when "oct" is 0, regardless of the "hcsl" being 0 or 1, all of the transistors do not allow current to flow to either the voltage source or ground. Therefore, with respect to FIG. 5, board 501 illustrates a general driver having two differential lines. Each line has respective impedance elements having an impedance of 50 ohms, respective capacitors 502 and 502, and respective resistor pairs 506 and 508 and 512 and 514 coupled to ground, one of each pair coupled to the differential line from either a voltage source or ground.

On the chip 503 side, each differential line is effectively connected to the ESD module via a short due to all of the resistors shown in FIG. 2 being turned off to current flow. In effect, this allows for external termination to occur off the chip 503, for example, within the general driver or on the board 501.

Figure 6:
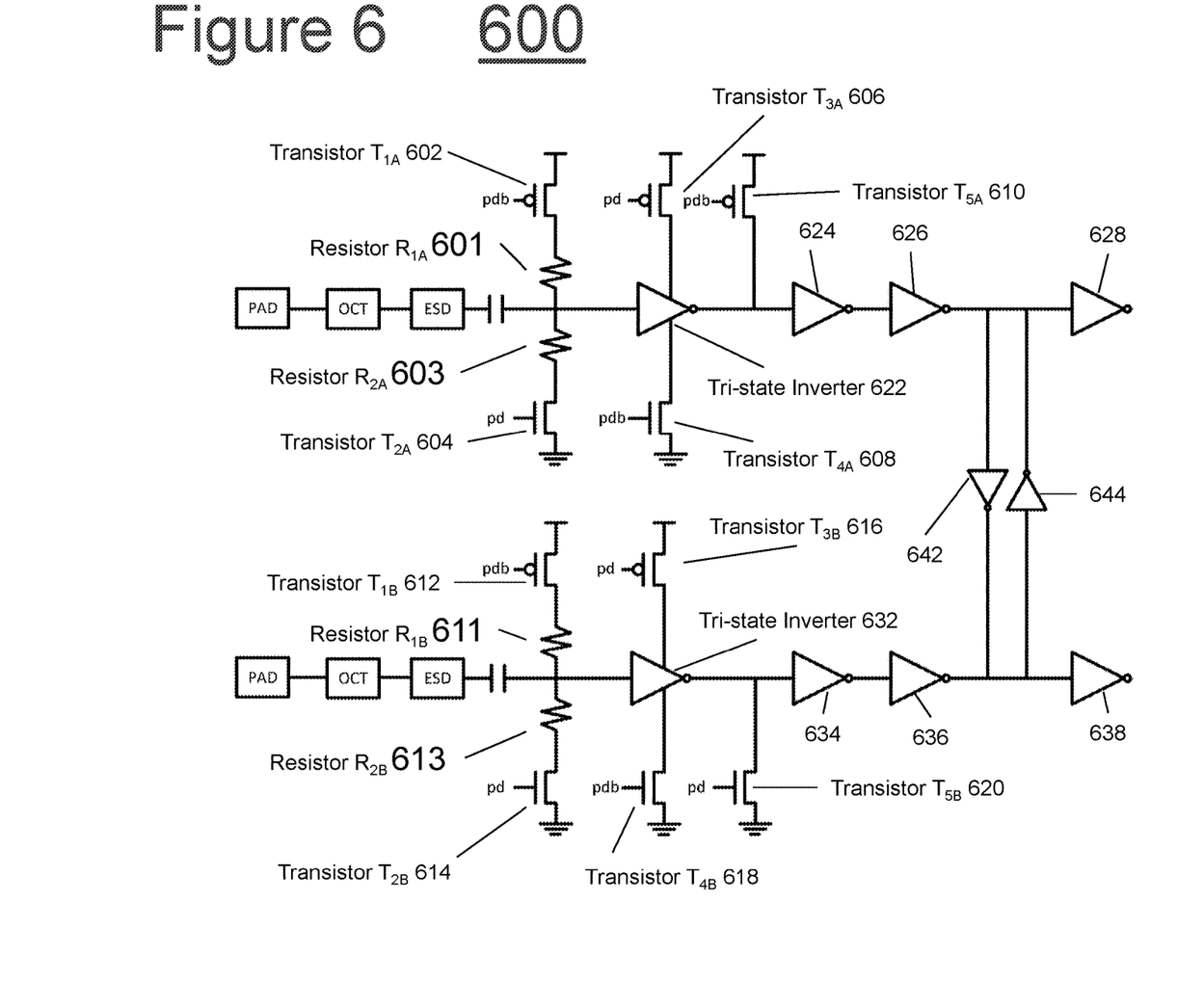
FIG. 6 is a diagram illustrating an embodiment of a power down circuit that can be employed in an embodiment of the present invention.

FIG. 6 is a diagram 600 illustrating an embodiment of a power down circuit that can be employed in an embodiment of the present invention. Diagram 600 illustrates two differential lines having two PAD, OCT, and ESD modules coupled to respective capacitors. For the first differential line, the capacitor is coupled to a tri-state inverter 622, which is coupled to a series of inverters 624, 626, and 628, where the outputs of each respective inverter are connected to the inputs of the next inverter in series, respectively. A transistor $T_{1A}$ 602 is coupled to allow current to flow from a voltage source to a resistor $R_{1A}$ 601, which is coupled to the input of the tri-state inverter 622, as well as the output of the capacitor on the first differential line. A transistor $T_{2A}$ 604 is coupled to allow current to flow from ground to a resistor $R_{2A}$ 603, which is coupled to the input of the tri-state inverter 622, as well as the output of the capacitor on the first differential line and the input to the inverter 622. Transistor $T_{1A}$ 602 receives a power down bar ("pdb") signal at its gate, while Transistor $T_{2A}$ receives a power down ("pd") signal at its gate.

The tri-state inverter 622 further is coupled to Transistor $T_{3A}$ 606 and Transistor $T_{4A}$ 608. Transistor $T_{3A}$ 606 is coupled to allow current from the voltage source to the tri-state inverter 622, and Transistor $T_{4A}$ 608 is coupled to allow current to flow from ground to the tri-state inverter 622. Transistor $T_{3A}$ 606 is coupled to receive signal "pd" at its gate, and Transistor $T_{4A}$ 608 is coupled receive to signal "pdb" at its gate. When current flows from Transistor $T_{3A}$ 606 and Transistor $T_{4A}$ 608 through the tri-state inverter 622, the tri-state inverter is in a low impedance state and allows current to flow from its input (e.g., the capacitor) to its output (e.g., to inverter 624). However, when current does not flow, it is in a high-impedance state and does not allow current to flow from its input to its output. The input of the tri-state inverters are biased at mid-rail to prevent the input MOSFET gate from breaking down during power-down with the presence of a large-amplitude clock.

Inverter 624 is coupled to receive the output of the tri-state inverter 622. The inverter 622 is further coupled to a Transistor $T_{5A}$. Transistor $T_{5A}$ is coupled to allow current to flow from the voltage source to inverter 624. The output of inverter 624 is coupled to the input of inverter 626, which itself is coupled to the input of inverter 628.

Inverter 624 is coupled to receive the output of the tri-state inverter 622. The inverter 622 is further coupled to a Transistor $T_{5A}$. Transistor $T_{5A}$ is coupled to allow current to flow from the voltage source to inverter 624. The output of inverter 624 is coupled to the input of inverter 626, which itself is coupled to the input of inverter 628.

The circuit, therefore, has two states based on the two signals to the respective transistors. A person of ordinary skill in the art can recognize that power down and power down bar are opposite signals (i.e., power down bar=0 when power down=1, and power down bar=1 when power down=0). Analyzing the first differential line, when power down is set to 1, current flows through Transistor $T_{1A}$ 602, Transistor $T_{2A}$ 604, and Transistor $T_{5A}$ 610. Current does not flow through Transistor $T_{3A}$ 606 and Transistor $T_{4A}$ 608, which puts the tri-state inverter 622 in a high-impedance state. The output of the tri-state inverter 622 then is pulled to the voltage source/power supply through transistor $T_{5A}$ 510.

Alternatively, when power down is set to 0 and power down accordingly set to 1, current does not flow through Transistor $T_{1A}$ 602, Transistor $T_{2A}$ 604, and Transistor $T_{5A}$ 610. Current does flow through Transistor $T_{3A}$ 606 and Transistor $T_{4A}$ 608, which puts the tri-state inverter in a low-impedance state and allows current to flow from its input to its output, through in-series inverters 624, 626, and 628.

The second differential line is configured in a similar manner to the first differential line described above. For the second differential line, the capacitor is coupled to a tri-state inverter 632, which is coupled to a series of inverters 634, 636, and 638, where the outputs of each respective inverter are connected to the inputs of the next inverter in series, respectively. A transistor $T_{1B}$ 612 is coupled to allow current to flow from a voltage source to a resistor $R_{1B}$ 611, which is coupled to the input of the tri-state inverter 632, as well as the output of the capacitor on the second differential line. A transistor $T_{2B}$ 614 is coupled to allow current to flow from ground to a resistor $R_{2B}$ 613, which is coupled to the input of the tri-state inverter 632, as well as the output of the capacitor on the first differential line and the input to the inverter 622. Transistor $T_{1B}$ 612 receives a power down bar ("pdb") signal at its gate, while Transistor $T_{2B}$ receives a power down ("pd") signal at its gate.

The tri-state inverter 622 further is coupled to Transistor $T_{3B}$ 616 and Transistor $T_{4B}$ 618. Transistor $T_{3B}$ 616 is coupled to allow current from the voltage source to the tri-state inverter 632, and Transistor $T_{4B}$ 618 is coupled to allow current to flow from ground to the tri-state inverter 632. Transistor $T_{3B}$ 616 is coupled to receive signal "pd" at its gate, and Transistor $T_{4B}$ 608 is coupled to receive signal "pdb" at its gate. When current flows from Transistor $T_{3B}$ 616 and Transistor $T_{4B}$ 618 through the tri-state inverter 632, the tri-state inverter 632 is in a low impedance state and allows current to flow from its input (e.g., the capacitor) to its output (e.g., to inverter 624). However, when current does not flow, the tri-state inverter 632 is in a high-impedance state and does not allow current to flow from its input to its output. The input of the tri-state inverters are biased at mid-rail to prevent the input MOSFET gate from breaking down during power-down with the presence of a large-amplitude clock.

Analyzing the second differential line, when power down is set to 1, current flows through Transistor $T_{1B}$ 612, Transistor $T_{2B}$ 614, and Transistor $T_{5B}$ 620. Current does not flow through Transistor $T_{3B}$ 616 and Transistor $T_{4B}$ 618, which puts the tri-state inverter 632 in a high-impedance state. The output of the tri-state inverter 632 then is pulled to the ground through transistor $T_{5B}$ 620.

Alternatively, when power down is set to 0 and power down accordingly set to 1, current does not flow through Transistor $T_{1B}$ 612, Transistor $T_{2B}$ 614, and Transistor $T_{5B}$ 620. Current does flow through Transistor $T_{3B}$ 616 and Transistor $T_{4B}$ 618, which puts the tri-state inverter in a low-impedance state and allows current to flow from its input to its output, through in-series inverters 634, 636, and 638.

In addition, in a differential embodiment, the output of inverter 626 and input of inverter 628 are both coupled to an input of an inverter 642 and an output of an inverter 644. The output of inverter 636 and input of inverter 638 are coupled to an output of inverter 644 and input of inverter 642.

While example embodiments have been particularly shown and described, it will be understood by those skilled in the art that various changes in form and details may be made therein without departing from the scope of the embodiments encompassed by the appended claims.

What is claimed is:

1. A method comprising:
generating a plurality of gate signals; and
sending the plurality of gate signals to a plurality of transistors, a transistor of the plurality of transistors coupled with a respective resistor of a plurality of resistors and at least one of a voltage source and a ground to allow, when a respective gate signal enables the transistor, current to flow through the transistor, the respective resistor, and the at least one of the voltage source and the ground, wherein at least two transistors of the plurality of transistors are in parallel branches.

2. The method of claim 1, wherein the plurality of resistors includes a first resistor coupled to allow current to flow from a first terminal of the first resistor to a second terminal of the first resistor.

3. The method of claim 1, wherein the plurality of resistors includes a second resistor coupled to a second transistor to allow current to flow from a first terminal of the second resistor to a second terminal of the second resistor to a ground.

4. The method of claim 1, wherein the plurality of resistors includes a third resistor coupled to a third transistor to allow current to flow from a first terminal of the third resistor to a second terminal of the third resistor to the ground.

5. The method of claim 1, wherein the plurality of resistors includes a first, second, and third resistor that are coupled by respective terminals at a common node.

6. The method of claim 1, wherein generating the plurality of gate signals includes generating a first gate signal based on a first logic operation of a first control signal and a second control signal.

7. The method of claim 1, wherein generating the plurality of gate signals is based on a first control signal and second control signal and wherein the second gate signal is based on the second control signal alone.

8. The method of claim 1, wherein generating the plurality of gate signals is based on a first control signal and second control signal and wherein a third gate signal is based on a second logic operation of the first control signal and the second control signal.

9. The method of claim 1, wherein generating the plurality of gate signals is based on a first control signal and second control signal and wherein the first control signal is an on-chip termination (OCT) signal and the second control signal is a current steering signal.

10. The method of claim 9, wherein the current steering signal is a high-speed current steering logic (HCSL).

11. The method of claim 1, wherein:
a first resistor, a second resistor, and a third resistor are coupled with a printed circuit board (PCB) trace, the PCB trace receiving a transmission from a driver;
a product of a second resistance of the second resistor and a third resistance of the third resistor divided by a sum of the second resistance and the third resistance produces a target resistance; and the second resistance divided by the sum of the first resistance and the second resistance times a voltage of the voltage source is a target voltage.

12. The method of claim 11, wherein generating the plurality of gate signals is based on a first control signal and second control signal and wherein:
the first control signal, configured to be in a first state, coupled to a gate of the first transistor is configured to allow current to flow through the first transistor;
the second control signal, configured to be in a second state, coupled to a gate of the second transistor is configured to allow current to flow through the second transistor;
a third control signal, configured to be in a third state, coupled to a gate of the third transistor is configured to prevent current from flowing through the third transistor.

13. The method of claim 11, wherein generating the plurality of gate signals is based on a first control signal and second control signal and wherein:
the first control signal, configured to be in a first state, coupled to a gate of the first transistor is configured to prevent current from flowing through the first transistor;
the second control signal, configured to be in a second state, coupled to a gate of the second transistor is configured to allow current to flow through the second transistor; and
a third control signal, configured to be in a third state, coupled to a gate of the third transistor is configured to allow current to flow through the third transistor.

14. The method of claim 11, wherein generating the plurality of gate signals is based on a first control signal and second control signal and wherein:
the first control signal, configured to be in a first state, coupled to a gate of the first transistor is configured to prevent current from flowing through the first transistor;
the second control signal, configured to be in a second state, coupled to a gate of the second transistor is configured to prevent current from flowing through the second transistor; and
a third control signal, configured to be in a third state, coupled to a gate of the third transistor is configured to prevent current from flowing through the third transistor.

15. The method of claim 1, wherein generating the plurality of gate signals is based on a first control signal and second control signal and wherein:
the first logic operation represents an AND operation of the second control signal and an inverse of the first control signal, and the second logic operation represents an OR operation of the inverse of the first control signal and the inverse of the second control signal.

16. A system comprising:
a plurality of transistors in a circuit; and
a signal generation circuit configured to generate a plurality of gate signals;
wherein a transistor of the plurality of transistors is coupled with a respective resistor of a plurality of resistors and at least one of a voltage source and a ground to allow, when a respective gate signal enables the transistor, current to flow through the transistor, the respective resistor, and the at least one of the voltage source and the ground.

17. The system of claim 16, wherein the plurality of resistors includes a first resistor coupled to allow current to flow from a first terminal of the first resistor to a second terminal of the first resistor.

18. The system of claim 16, wherein the plurality of resistors includes a second resistor coupled to a second transistor to allow current to flow from a first terminal of the second resistor to a second terminal of the second resistor to a ground.

19. The system of claim 16, wherein the plurality of resistors includes a third resistor coupled to a third transistor to allow current to flow from a first terminal of the third resistor to a second terminal of the third resistor to the ground.

20. The system of claim 16, wherein the plurality of resistors includes a first, second, and third resistor that are coupled by respective terminals at a common node.

21. The system of claim 16, wherein the signal generation circuit is configured to generate the plurality of gate signals based on a plurality of control signals including a first control signal and a second control signal and wherein the signal generation circuit is further configured to generate a first gate signal based on a first logic operation of the first control signal and the second control signal.

22. The system of claim 16, wherein the signal generation circuit is configured to generate the plurality of gate signals based on a plurality of control signals including a first control signal and a second control signal and wherein the second gate signal is based on the second control signal alone.

23. The system of claim 16, wherein the signal generation circuit is configured to generate the plurality of gate signals based on a plurality of control signals including a first control signal and a second control signal and wherein a third gate signal is based on a second logic operation of the first control signal and the second control signal.

24. The system of claim 16, wherein the signal generation circuit is configured to generate the plurality of gate signals based on a plurality of control signals including a first control signal and a second control signal and wherein the first control signal is an on-chip termination (OCT) signal and the second control signal is a current steering signal.

25. The system of claim 16, wherein the current steering signal is a high-speed current steering logic (HCSL).

26. The system of claim 16, wherein:
a first resistor, a second resistor, and a third resistor are coupled with a printed circuit board (PCB) trace, the PCB trace receiving a transmission from a driver;
a product of a second resistance of the second resistor and a third resistance of the third resistor divided by a sum of the second resistance and the third resistance produces a target resistance;
the second resistance divided by the sum of the first resistance and the second resistance times a voltage of the voltage source is a target voltage.

27. The system of claim 26, wherein the signal generation circuit is configured to generate the plurality of gate signals based on a plurality of control signals including a first control signal and a second control signal and wherein:
the first control signal coupled to a gate of the first transistor is configured to allow current to flow through the first transistor;
the second control signal coupled to a gate of the second transistor is configured to allow current to flow through the second transistor;

a third control signal coupled to a gate of the third transistor is configured to prevent current from flowing through the third transistor.

28. The system of claim 26, wherein the signal generation circuit is configured to generate the plurality of gate signals based on a plurality of control signals including a first control signal and a second control signal and wherein:
- the first control signal coupled to a gate of the first transistor is configured to prevent current from flowing through the first transistor;
- the second control signal coupled to a gate of the second transistor is configured to allow current to flow through the second transistor;
- a third control signal coupled to a gate of the third transistor is configured to allow current to flow through the third transistor.

29. The system of claim 26, wherein the signal generation circuit is configured to generate the plurality of gate signals based on a plurality of control signals including a first control signal and a second control signal and wherein:
- the first control signal coupled to a gate of the first transistor is configured to prevent current from flowing through the first transistor;
- the second control signal coupled to a gate of the second transistor is configured to prevent current from flowing through the second transistor;
- a third control signal coupled to a gate of the third transistor is configured to prevent current from flowing through the third transistor.

30. The system of claim 26, wherein the signal generation circuit is configured to generate the plurality of gate signals based on a plurality of control signals including a first control signal and a second control signal and wherein:
- the first logic operation represents an AND operation of the second control signal and the inverse of the first control signal, and
- the second logic operation represents an OR operation of the inverse of the first control signal and the inverse of the second control signal.

* * * * *